US007840014B2

(12) United States Patent
Asakawa

(10) Patent No.: US 7,840,014 B2
(45) Date of Patent: Nov. 23, 2010

(54) SOUND APPARATUS WITH HOWLING PREVENTION FUNCTION

(75) Inventor: Shinji Asakawa, Shizuoka-ken (JP)

(73) Assignee: Roland Corporation, Shizuoka-ken, Hamamatsu (JP)

( * ) Notice: Subject to any disclaimer, the term of this patent is extended or adjusted under 35 U.S.C. 154(b) by 1256 days.

(21) Appl. No.: 11/393,505

(22) Filed: Mar. 29, 2006

(65) Prior Publication Data

US 2006/0222188 A1 Oct. 5, 2006

(51) Int. Cl.
*H04B 15/00* (2006.01)
*H04R 27/00* (2006.01)
*H03G 5/00* (2006.01)
*G10L 21/02* (2006.01)
*H04K 1/02* (2006.01)

(52) U.S. Cl. .................... 381/94.1; 381/94.3; 381/94.2; 381/1; 381/83; 381/98; 381/93; 375/296; 704/226

(58) Field of Classification Search .................. 381/93, 381/94.1–94.3, 326, 1, 83, 98; 704/226; 375/296
See application file for complete search history.

(56) References Cited

U.S. PATENT DOCUMENTS 5,245,665 A * 9/1993 Lewis et al. .................. 381/93
5,677,987 A * 10/1997 Seki et al. .................. 704/226
5,710,823 A 1/1998 Nagata et al.
5,729,614 A 3/1998 Nagata et al.
7,197,152 B2 * 3/2007 Miller et al. ................ 381/326
7,639,755 B2 * 12/2009 Ishikawa et al. ............ 375/296
2006/0062395 A1 * 3/2006 Klayman et al. ............... 381/1
2007/0280487 A1 * 12/2007 Ura et al. ...................... 381/93

FOREIGN PATENT DOCUMENTS

JP 2773656 4/1998
JP 2773678 4/1998

* cited by examiner

*Primary Examiner*—Devona E Faulk
(74) *Attorney, Agent, or Firm*—Foley & Lardner LLP

(57) ABSTRACT

An acoustic system that eliminates the howling that occurs when the sound outputted by the speaker feeds back to the input device. The acoustic system comprises a digital signal processor (DSP) that divides the input audio signal into different frequency bands, and reduces the audio levels for the frequency bands where howling is most likely to occur. In one embodiment, the acoustic system comprises a sound source section that generates a test tone that substantially covers the entire human audible range such that the DSP can set the filter levels according to the feedback of the test tone. In another embodiment, the sound source section stores one waveform at a given pitch and generates waveforms of other pitches based on the stored waveform. In yet another embodiment, the pitches of the generated waveforms are dispersed into four frequency bands to create a test tone that resembles a chord or a musical tone.

20 Claims, 6 Drawing Sheets

SOUND APPARATUS WITH HOWLING PREVENTION FUNCTION

CROSS-REFERENCE TO RELATED PATENT APPLICATIONS

This application claims priority to Japanese patent applications Nos. 2005-108462 and 2005-108471 (each filed on Apr. 5, 2005), which were assigned to the applicant and are incorporated herein by reference in their entireties.

BACKGROUND OF THE INVENTION

The present invention relates to an acoustic system that is furnished with a howling prevention capability.

With acoustic systems in which an audio signal inputted from a microphone is amplified and outputted from a speaker, when the microphone is brought close to the speaker or when the output level from the speaker is raised, there are times when howling occurs. This is caused by the occurrence of an oscillation state in which the sound outputted from the speaker feeds back into the microphone.

For some time, many proposals have been made in order to prevent this howling. For example, Japanese Patent Publication Number 2773656 discloses an acoustic system which emits a white noise into space from a speaker as a test signal, the sound in the space is input to a microphone. The disclosed acoustic system then measures the frequency characteristics of the space, and uses the measurement results to determine the frequency characteristics of a filter. Thus, the production of the howling is prevented by the reduction of the level of a specific frequency.

However, with the acoustic system described above, there is the problem that because a white noise is generated as a test signal, it grates extremely on the human ear. In addition, in those cases where a wave such as a sine wave is used as the test signal, together with grating on the ear in the same manner, there is also a weakness that a large number of test signals covering the entire range of the audible frequency band must be generated. Thus, it takes a long time to generate the signals while successively changing the frequencies, making the processing complicated.

The present invention addresses problems as discussed above and has as an object the provision of an acoustic system that has a simple configuration and that generates a test signal that is satisfactory with regard to avoiding grating on the human ear.

SUMMARY OF THE DISCLOSURE

In order to achieve the objects discussed above, the acoustic system according to a first preferred embodiment of the present invention is a single unit that comprises input means with which an audio signal is input, conversion means that converts the audio signal from the input means into a digital signal, a howling prevention system that comprises a digital filter which reduces the output level of a specific frequency component of the digital signal converted by the conversion means, and an amplification system that amplifies the audio signal. In this embodiment, the howling prevention system changes the frequency characteristics of the audio signal.

In a second preferred embodiment, the howling prevention system of the acoustic system from the first embodiment further comprises frequency characteristics detection means that detects the frequency characteristics of the audio from the input means, and frequency designation means that designates a frequency based on the detected frequency characteristics. Furthermore, in the second embodiment, the digital filter reduces the output level of the frequency designated by the frequency designation means.

In a third preferred embodiment, the acoustic system according to the first embodiment further comprises a speaker that is driven by the output of the amplification system, as a single unit system.

In a fourth preferred embodiment, the acoustic system according to the second preferred embodiment further comprises sound source means and output means. In this embodiment, the sound source means generates an audio signal at a specified sampling period, such that the generated audio signal has some sample points that have a series of amplitude values and some sample points with amplitude values of 0 between adjacent sample points with an amplitude value. Furthermore, the output means outputs the audio signal generated by the sound source means into space, the input means inputs the audio signal outputted by the output means, and the digital filter reduces the output level of the frequency designated by the frequency designation means.

In a fifth preferred embodiment, the sound source means of the acoustic system according to the fourth embodiment further comprises waveform storage means, amplitude value readout means, and sample point addition means. In this embodiment, the waveform storage means stores a series of amplitude values in which specified waveforms have been sampled at a specified sampling period; the amplitude value readout means reads out successive amplitude values from the waveform storage means; and, the sample point addition means adds the sample points with amplitude values of 0 between the adjacent amplitude values read out by the amplitude value readout means, at a specified sampling period.

In a sixth preferred embodiment, the waveform storage means of the acoustic system of the fifth preferred embodiment stores the waveforms of the audio signals of a specified frequency band. In addition, the sound source means further comprises pitch changing means that controls the amplitude value readout means, such that the amplitude value readout means changes and reads out the pitch of the waveform that is read out.

In a seventh preferred embodiment, the acoustic system of the second preferred embodiment further comprises level correction means and control means. The level correction means corrects the level for a frequency detected by the frequency characteristics detection means by the elimination of a level change that is gently changed for the frequency. The control means carries out control such that from among the levels that correspond to the frequencies that have been corrected by the level correction means, the frequency for which the level is great is assigned as the frequency for which the output level is reduced on a priority basis by the digital filter.

In an eighth preferred embodiment, the level correction means of the acoustic system of the seventh preferred embodiment corrects by subtracting the running mean value of the level for the frequency from the value of the level for the frequency.

In a ninth preferred embodiment, the level correction means of the acoustic system of the seventh embodiment corrects the value of the level for the frequency such that as the frequency becomes higher, the value of the level becomes greater.

In a tenth preferred embodiment, the filter means of the acoustic system of the seventh preferred embodiment further comprises a plurality of notch filters that reduces the levels for a plurality of frequencies. In addition, the control means carries out control such that the center frequencies of each of the notch filters are assigned in succession to the frequencies for which the levels corrected by the level correction means are greater.

In an eleventh preferred embodiment, an acoustic system comprises input means in which an audio signal is input; filter means that detects the frequency characteristics of the input audio signal, and reduces the output level of a specific frequency component of the input audio signal in conformance with the detected frequency characteristics; and, sound source means that generates an audio signal at a specified sampling period. In this embodiment, the audio signal generated by the sound source means has sample points that have a series of amplitude values and sample points with amplitude values of 0 between adjacent sample points with non-zero amplitude values. Furthermore, the output means outputs the audio signal generated by the sound source means into space, and the input means inputs the audio signal outputted by the output means.

In a twelfth preferred embodiment, the sound source means of the eleventh embodiment further comprises waveform storage means, amplitude value readout means, and sample point addition means. The waveform storage means stores a series of amplitude values in which specified waveforms have been sampled at a specified sampling period; the amplitude value readout means reads out the amplitude values in succession from the waveform storage means; and, the sample point addition means adds the sample points between the adjacent amplitude values read out by the amplitude value readout means at a specified sampling period, wherein the added sample points have amplitude values of 0.

In a thirteenth preferred embodiment, the waveform storage means stores the waveforms of the audio signals in a specified frequency band. The sound source means comprises pitch changing means that controls the readout pitch of the amplitude value readout means, such that the amplitude value readout means changes and reads out the pitch of the waveform that is read out.

An acoustic system according to a fourteenth preferred embodiment comprises input means, filter means, frequency characteristics detection means, level correction means, and control means. The input means inputs an audio signal. The filter means reduces the output level of a specific frequency component of the audio signal from the input means. The frequency characteristics detection means detects the level for the frequency of the audio signal from the input means. The level correction means corrects the level for the frequency detected by the frequency characteristics detection means by the elimination of a level change that is gently changed for the frequency. The control means carries out control such that from among the levels that correspond to the frequencies that have been corrected by the level correction means, the frequency for which the level is great is assigned as the frequency for which the output level is reduced on a priority basis by the filter means.

In a fifteenth preferred embodiment, the level correction means of the acoustic system of the fourteenth embodiment corrects by subtracting the running mean value of the level for the frequency from the value of the level for the frequency.

In a sixteenth preferred embodiment, the level correction means of the acoustic system of the fourteenth embodiment corrects the level for the frequency such that as the frequency becomes higher, the value of the level becomes a greater value.

In a seventeenth preferred embodiment, the acoustic system of the fourteenth embodiment has the additional feature that the filter means comprises notch filters which reduces the levels for a plurality of frequencies, and the control means that carries out control such that the center frequencies of the notch filters are assigned in succession to the frequencies for which the levels corrected by the level correction means are greater.

In accordance with the acoustic system of the first preferred embodiment, because the system is a single unit that comprises input means with which an audio signal is input, conversion means that converts the audio signal from the input means into a digital signal, a howling prevention system that comprises a digital filter which reduces the output level of a specific frequency component of the digital signal converted by the conversion means, and an amplification system that amplifies the audio signal, wherein the howling prevention system changes the frequency characteristics of the audio signal, it is possible for the howling prevention system to carry out control that is appropriate to the frequency characteristics of the amplifier. Furthermore, the frequency component for which the level is to be reduced can be set to an optimum value and, together with this, it is possible to also set the level reduction setting value. Thus, an advantage is that optimum control of the howling prevention can be carried out to prevent the degradation of the quality of the original sound.

In accordance with the acoustic system of the second preferred embodiment, in addition to the advantages exhibited by the acoustic system of the first embodiment, since the howling prevention system further comprises frequency characteristics detection means that detects the frequency characteristics of the audio from the input means, frequency designation means that designates a frequency based on the detected frequency characteristics, and wherein the digital filter reduces the output level of the frequency designated by the frequency designation means, it is therefore possible to set the frequency component for level reduction to an optimum value. Thus, there is an advantage to further prevent the degradation of the quality of the original sound while carrying out optimum control of the howling prevention.

In accordance with the acoustic system of the third preferred embodiment, in addition to the advantages of the first embodiment, since the system further comprises a speaker that is driven by the output of the amplification system, as a single unit system, it is possible to set the frequency component for the level reduction to an optimum value and also set the setting value for the level reduction. Therefore, this achieves an advantage of further preventing the degradation of the quality of the original sound while carrying out optimum control of the howling prevention.

In the acoustic system of the fourth embodiment, the system of the second preferred embodiment further comprises sound source means and output means. In this embodiment, the sound source means generates an audio signal at a specified sampling period, such that the generated audio signal has some sample points that have a series of amplitude values and some sample points with amplitude values of 0 between adjacent sample points with an amplitude value; the output means outputs the audio signal generated by the sound source means into space; and, the input means inputs the audio signal outputted by the output means and the digital filter reduces the output level of the frequency designated by the frequency designation means. In addition to the advantages of the second embodiment, the sound that is emitted into space by the system of the fourth embodiment is different from a simple sine wave or white noise. Since the sound is audio with a reasonable degree of harmonics, there is the further advantage that the sound does not grate on the human ear.

In the acoustic system of the fifth embodiment, the sound source means of the fourth embodiment further comprises waveform storage means, amplitude value readout means, and sample point addition means. In this embodiment, the waveform storage means stores a series of amplitude values in which specified waveforms have been sampled at a specified sampling period; the amplitude value readout means reads out successive amplitude values from the waveform storage means; and, the sample point addition means adds the sample points with amplitude values of 0 between the adjacent amplitude values read out by the amplitude value readout means, at a specified sampling period. Hence, there is the additional advantage that it is possible to generate a test signal that does not grate on the ear with a simple configuration. In addition, since only the amplitude value of the waveform is stored in the waveform storage means and sample points with amplitude values of 0 are inserted by the sample point addition means, it is possible to keep the storage capacity of the waveform storage means small.

In the acoustic system of the sixth preferred embodiment, the waveform storage means stores the waveforms of the audio signals of a specified frequency band, and the sound source means further comprises pitch changing means that controls the amplitude value readout means to change and read out the pitch of the waveform that is read out. Hence, in addition to the advantages of the fifth embodiment, there is the further advantage that it is possible to form a sound satisfactory with regard to grating on the ears across the entire audible band.

In addition, compared to the case in which a test signal that covers the entire range of audible frequencies is generated using a simple sine wave, the sound source means of the present invention generates a sound that includes many harmonics. Hence, there is the advantage that the number of waveforms for different frequencies where the frequencies are successively changed can be few, and the time required for generating the test signal is short, and therefore the processing becomes simpler.

In the acoustic system of the seventh embodiment, the acoustic system further comprises level correction means and control means. The level correction means corrects the level for a frequency detected by the frequency characteristics detection means by the elimination of a level change that is gently changed for the frequency. The control means carries out control such that from among the levels that correspond to the frequencies that have been corrected by the level correction means, the frequency for which the level is great is assigned as the frequency for which the output level is reduced on a priority basis by the digital filter.

Therefore, in addition to the advantages of the second embodiment, in the seventh embodiment, the frequency characteristics detected by the frequency characteristics detection means are frequency characteristics corrected and unaffected by cases where there is a change of the environment such as the movement of people. In particular, the peaks of the frequencies in the high registers are effectively detected, and there is the advantage that it is possible to further prevent the generation of howling.

In particular, when a person comes close to the vicinity of the microphone (an example of input means), the high region of the frequency characteristics becomes raised; if the frequency of the filter is assigned based on the level of the frequency characteristics without carrying out a correction by the elimination of the level change for the frequencies in which the change is gentle, howling would be generated. However, with the seventh embodiment, since the correction is carried out by eliminating gentle changes in the level for the frequency, it is thus possible to prevent the generation of howling when a person comes near.

In accordance with the acoustic system of the eighth preferred embodiment, in addition to the advantages of the seventh embodiment, since the level correction means corrects by subtracting the running mean value of the level for the frequency from the value of the level for the frequency, there is the additional advantage that the correction can be carried out with simple processing.

In accordance with the acoustic system according to the ninth embodiment, in addition to the advantages of the seventh embodiment, since the level correction means corrects the value of the level for the frequency such that as the frequency becomes higher the value of the level becomes greater, there is the advantage that if the adjustment to prevent howling is carried out when not many people are present in the space near the acoustic system, it is still possible to effectively prevent howling when more people enter the space after the adjustment.

In other words, when the adjustment is carried out to prevent howling when there are not many people in the space near the acoustic system, the levels of the registers for which the frequency characteristics are high are low; when more people enter the space, the levels of the registers for which the frequency characteristics are high are raised. Thus, by correcting the levels of the frequencies higher for high frequency characteristics in advance, it is possible to carry out the prevention of howling that corresponds to the state of having more people present.

In the acoustic system of the tenth preferred embodiment, the filter means further comprises a plurality of notch filters that reduces the levels for a plurality of frequencies. In addition, the control means carries out control such that the center frequencies of each of the notch filters are assigned in succession to the frequencies for which the levels corrected by the level correction means are greater. Hence, there is the advantage that the levels of the frequencies for which howling is likely to occur are reduced, and it is possible to prevent the generation of howling.

In accordance with the eleventh embodiment, the acoustic system comprises input means in which an audio signal is input; filter means that detects the frequency characteristics of the input audio signal, and reduces the output level of a specific frequency component of the input audio signal in conformance with the detected frequency characteristics; and, sound source means that generates an audio signal at a specified sampling period. In this embodiment, the audio signal generated by the sound source means has sample points that have a series of amplitude values and sample points with amplitude values of 0 between adjacent sample points with non-zero amplitude values. Furthermore, the output means outputs the audio signal generated by the sound source means into space, and the input means inputs the audio signal outputted by the output means. Therefore, because the sound emitted into space is different from a simple sine wave or white noise and is audio with a reasonable degree of harmonics, there is the advantage that the sound is audio that does not grate on the human ear.

In accordance with the acoustic system of the twelfth preferred embodiment, the sound source means further comprises waveform storage means, amplitude value readout means, and sample point addition means. The waveform storage means stores a series of amplitude values in which specified waveforms have been sampled at a specified sampling period; the amplitude value readout means reads out the amplitude values in succession from the waveform storage means; and, the sample point addition means adds the sample points between the adjacent amplitude values that have been read out by the amplitude value readout means with the plurality of amplitude values at 0 at a specified sampling period. Hence, in addition to the advantages of the eleventh embodiment, there is the further advantage that it is possible to form a test signal that is satisfactory with regard to grating on the ear with a simple configuration. In addition, since only the amplitude value of the waveform is stored in the waveform storage means and sample points with amplitude values of 0 are inserted by the sample point addition means, it is possible to make the storage capacity of the waveform storage means small.

In accordance with the acoustic system in the thirteenth preferred embodiment, in addition to advantages exhibited by the acoustic system of the twelfth embodiment, the waveform storage means stores the waveforms of the audio signals in a specified frequency band, and the sound source means comprises pitch changing means that controls the readout pitch of the amplitude value readout means, such that the amplitude value readout means changes and reads out the pitch of the waveform that is read out. Hence, there is the advantage that it is possible to form a sound that is satisfactory with regard to grating on the ears across the entire audible band.

In addition, compared to the case where a test signal covering the entire audible frequency band is generated using a simple sine wave, the sound source means of the present invention generates a sound that contains many harmonics; hence, there is the advantage that the number of waveforms of different frequencies for the case in which the frequencies are changed in succession can be held low, the time required for the generation of the test signal is short, and the processing also is simple.

The acoustic system according to the fourteenth preferred embodiment comprises input means, filter means, frequency characteristics detection means, level correction means, and control means. The input means inputs an audio signal. The filter means reduces the output level of a specific frequency component of the audio signal from the input means. The frequency characteristics detection means detects the level for the frequency of the audio signal from the input means. The level correction means corrects the level for the frequency detected by the frequency characteristics detection means by the elimination of a level change that is gently changed for the frequency. The control means carries out control such that from among the levels that correspond to the frequencies that have been corrected by the level correction means, the frequency for which the level is great is assigned as the frequency for which the output level is reduced on a priority basis by the filter means.

Therefore, in the fourteenth embodiment, the frequency characteristics detected by the frequency characteristics detection means are frequency characteristics that are corrected without being affected by changes such as the movement of people. In particular, the peaks of the frequencies in the high registers are effectively detected, and there is the advantage that it is possible to prevent the generation of howling.

In particular, when a person comes close to the vicinity of the microphone (an example of the input means), high region of the frequency characteristics is raised; if the frequency of the filter is assigned based on the level of the frequency characteristics without carrying out a correction by eliminating the gentle level changes of the frequency, howling would be generated when a person comes near. However, when the correction is carried out by the elimination of the gentle change in the level for the frequency, it is possible to prevent the generation of howling in when a person comes near.

In accordance with the acoustic system of the fifteenth preferred embodiment, in addition to the advantages of the fourteenth embodiment, since the level correction means corrects by subtracting the running mean value of the level for the frequency from the value of the level for the frequency, there is the advantage that it is possible to carry out the correction with simple processing.

In accordance with the acoustic system of the sixteenth embodiment, in addition to the advantages of the fourteenth embodiment, since the level correction means corrects the level for the frequency such that as the frequency becomes higher the value of the level becomes greater, there is the advantage that even when the adjustment is carried out to prevent howling when not many people are present near the acoustic system, it is still possible to effectively prevent howling even when people later enter the space.

In other words, in those cases when the adjustment is carried out to prevent howling when there are not many people in the space in which the acoustic system is placed, the levels of the registers for which the frequency characteristics are high are low; when people enter the space, the levels of the registers for which the frequency characteristics are high are raised. Thus, by correcting the levels high of the frequencies for which the frequency characteristics are high in advance, it is possible to prevent howling that corresponds to the state when more people are present.

In accordance with the acoustic system of the seventeenth embodiment, in addition to the advantages of the fourteenth embodiment, since the filter means comprises notch filters which reduces the levels for a plurality of frequencies, and the control means that carries out control such that the center frequencies of the notch filters are assigned in succession to the frequencies for which the levels corrected by the level correction means are greater, there is the advantage that the levels of the frequencies for which howling is likely to occur are reduced, and it is possible to prevent the generation of howling.

DETAILED DESCRIPTION OF PREFERRED EMBODIMENTS

Figure 1:
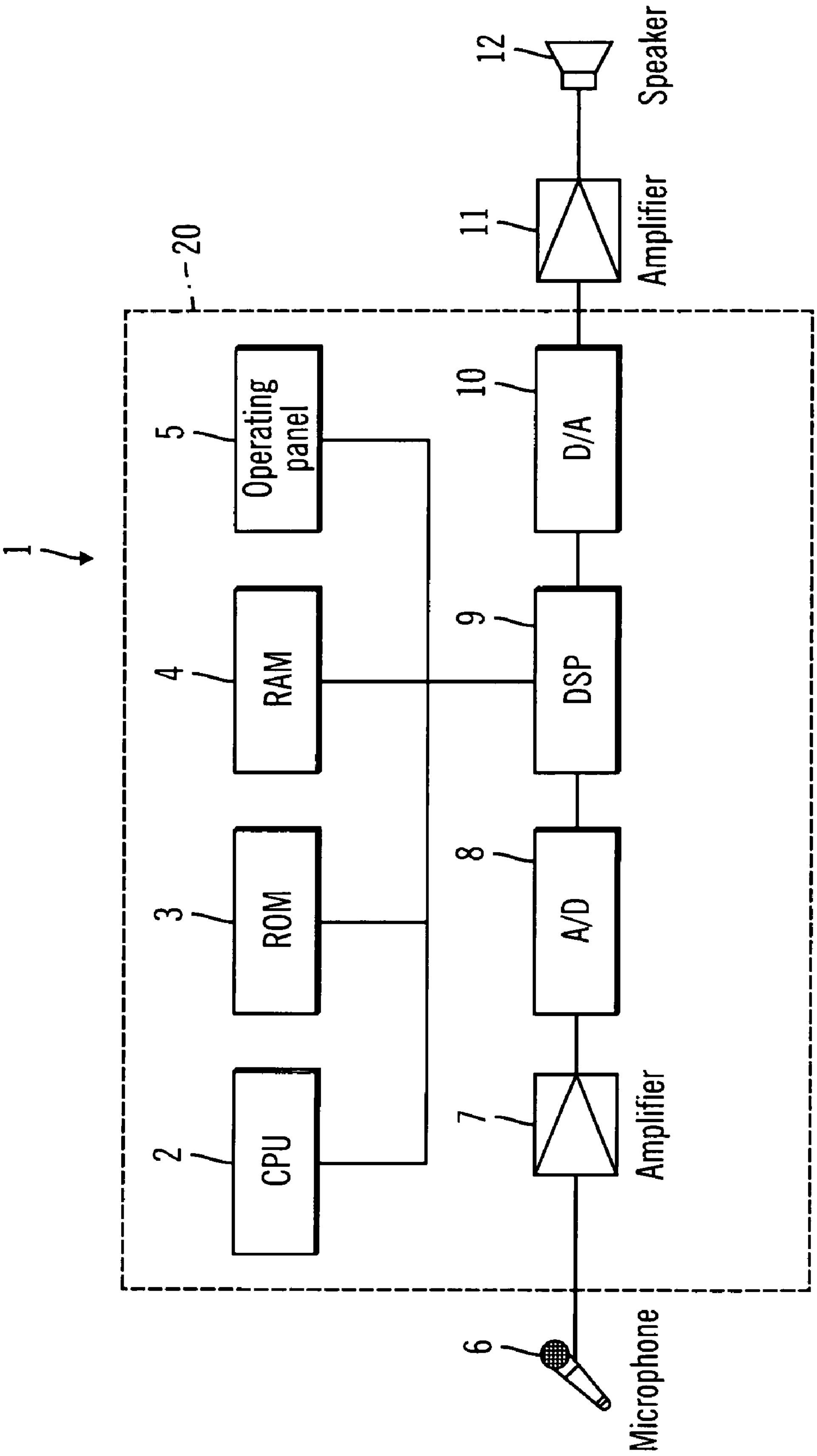
FIG. 1 is a block diagram that shows the electrical configuration of the acoustic system in a preferred embodiment in accordance with the present invention.

An explanation will be given below of one preferred embodiment of the present invention while referring to the attached drawings. FIG. 1 is a block diagram that shows the electrical configuration of the acoustic system 1 that is in accordance with an embodiment of the present invention. As is shown in FIG. 1, the acoustic system 1 comprises a howling prevention system 20, an amplifier 11, and a speaker 12.

The howling prevention system 20 comprises a CPU (central processing unit) 2, a ROM 3 in which programs executed by the CPU 2 are stored, a RAM 4, an operating panel 5, and a DSP (digital signal processor) 9, which are all mutually connected via a bus. A microphone 6, an amplifier 7 for the microphone, and an A/D converter 8 are connected to the DSP 9 on the input side, and the D/A converter 10 is connected to the DSP 9 on the output side.

The howling prevention system 20, the amplifier 11, and the speaker 12 are assembled as a single unit in one case.

Figure 2:
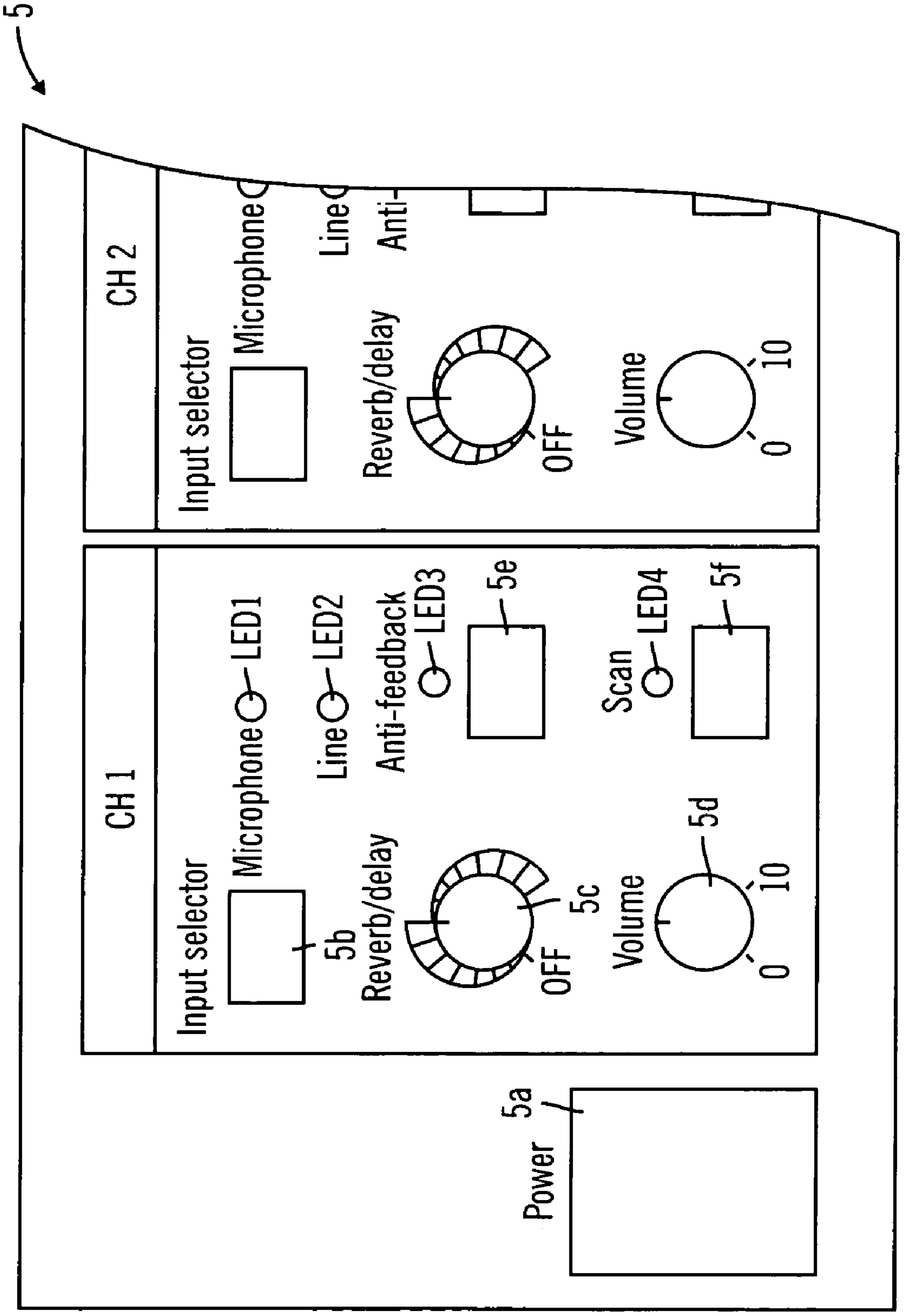
FIG. 2 is a planar drawing that shows the operating panel of the acoustic system.

FIG. 2 is an operating panel drawing that shows the details of the operating panel 5. The operating panel 5 comprises a power switch 5*a*, which turns the power to the acoustic system 1 on and off, and a plurality of operators that correspond to each of the channels. An explanation will be given here regarding the operators corresponding to channel 1, and the similar explanations regarding the operators for the other channels will be omitted.

The input selector switch 5*b* is a switch that sets whether the input device that is connected to that channel is the one that outputs microphone level or line level. When the microphone level is selected, the LED 1 is lit; and when the line level is selected, the LED 2 is lit.

The reverb/delay setting knob Sc sets the depth of either of the effects of reverb or delay that is applied to the audio inputted to this channel. The depth of the reverb is set by setting the knob to a position on the left half, and the depth of the delay is set by setting the knob to a position on the right half. The volume control knob 5*d* is a knob that adjusts the volume of audio inputted to the channel.

The anti-feedback switch 5*e* is a switch that toggles the anti-feedback function (the howling prevention function) effective or ineffective for the channel. When the anti-feedback function is set to be effective, the LED 3 is lit. When the anti-feedback function is set to be effective, the level of a specified frequency for the audio signal inputted is reduced by the notch filter. This operation will be discussed later while referring to FIG. 3.

The scan switch 5*f* is a switch that starts the built-in sound source in order to carry out the setting of the frequency of the notch filter section 23 when the anti-feedback function is effective. From the time that the sound source begins oscillation until the completion of the setting of the notch filter 23, the LED 4 flashes.

Figure 3:
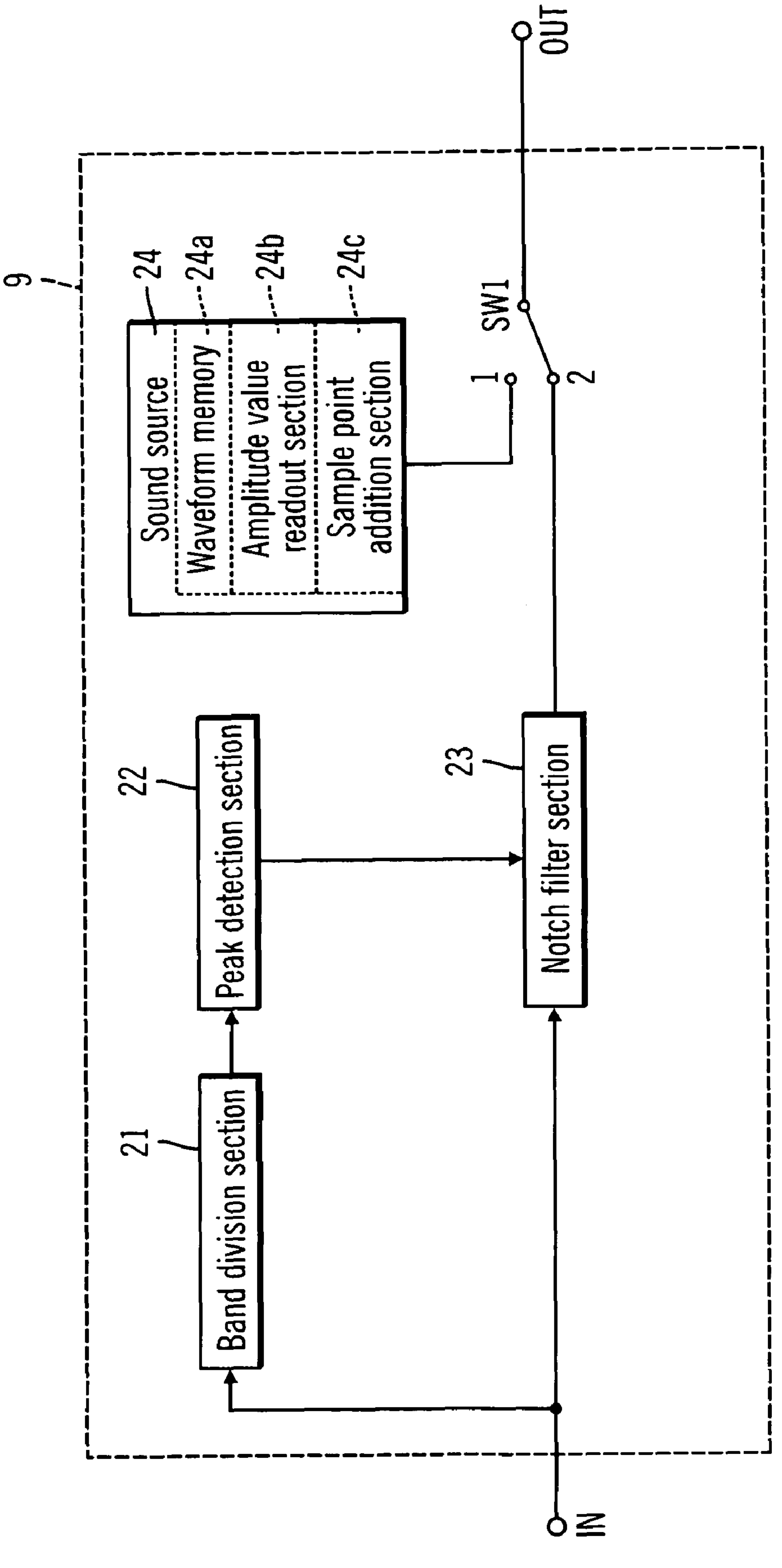
FIG. 3 is a block diagram that functionally shows the processing in the DSP.

FIG. 3 is a functional block diagram of the DSP 9. Descriptions regarding the functions that are related to effects such as reverb, delay, and others, have been omitted. The digital amplitude value, which has been converted by the A/D converter 8 at a specified sampling frequency (for example 48 kHz), is inputted to the band division section 21 and the notch filter section 23.

The band division section 21 comprises a band-pass filter that divides the range of frequency from 20 Hz to 20 kHz, which is the spectrum of the input audio, into 50 bands. The peak value of the level of each band is detected by the peak detection section 22. In the peak detection circuit of the peak detection section 22 that corresponds to each band, the peak value is set to 0 at the start of the measurement and the largest value of the level inputted after that is retained.

The frequencies for which the probability is high that howling will occur are detected in conformance with the peak values for each band detected by the peak detection section 22; the notch filter section 23 is set for these detected frequencies. The details regarding the detection of the selected frequencies will be discussed later.

The DSP 9 further comprises a sound source section 24. When the scan switch 5*f* is operated, the musical tones of the frequency components from 50 Hz to just under 24 kHz, which covers the audible frequency band, are generated in succession at a uniform level. In the sound source section 24, a 200 Hz sine wave is sampled for one cycle at a specified sampling frequency Fs (48 kHz in this embodiment) and the amplitude values are stored in address order.

The amplitude value readout section 24*b* carries out processing to read out in succession the amplitude values that have been stored in the waveform memory 24*a*, with the capability to read out the amplitude values one at a time or skipping some plurality of them. In those cases where the amplitude values are read out one at a time, the pitch of the waveforms that have been read out is 200 Hz; and in those cases where two are skipped and the pitch is read out, the pitch of the waveforms is 600 Hz. In those cases where four are skipped and the pitch is read out, the pitch of the waveforms is 1,000 Hz; and in those cases where six are skipped and the pitch is read out, the pitch is 1,400 Hz.

The amplitude readout section 24*b* reads out and outputs the amplitude value one time within the period SP specified by the sampling frequency described above, and the sample point addition section 24*c* carries out the processing that outputs the sample points with amplitude values of 0 in the period of the following three times.

The output of the sound source section 24 and the output of the notch filter section 23 are connected to the inputs 1 and 2 of the switch SW 1, which connects one of the two inputs to the D/A converter 10 from the DSP 9.

When the scan switch 5*f* is operated, SW 1 is connected to input 1, the audio generated by the sound source section 24 is output. In this state, band division of the audio that is inputted from the microphone 6 is done, the peak value of each band is detected by the peak detection section 22, and the notch filter section 23 is set.

When the setting of the notch filter section 23 is completed, SW 1 is connected to the input 2, the levels of those frequencies for which the probability of howling is high are reduced by the notch filter section 23, and the generation of howling is thus limited.

Figure 4:
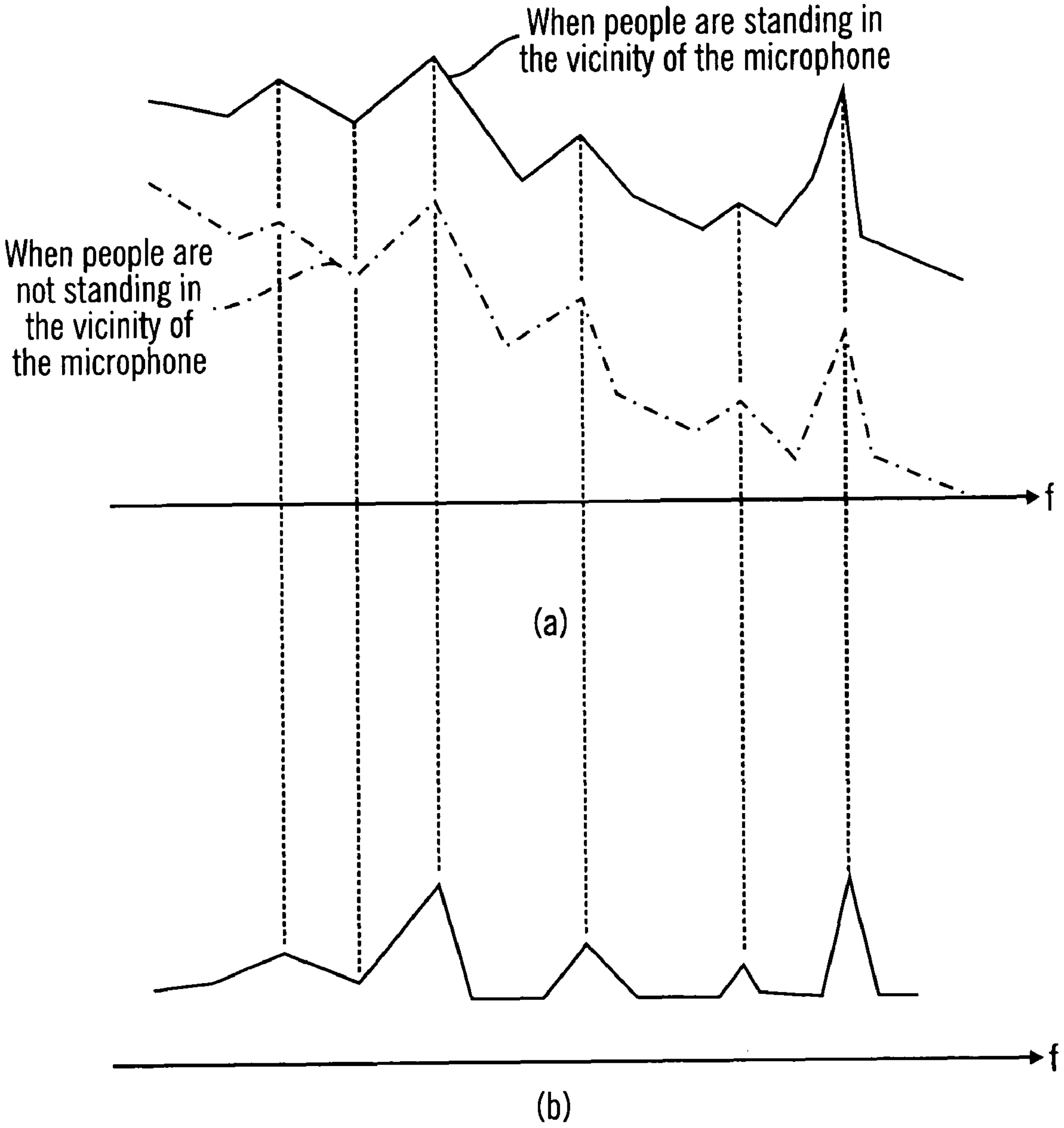
FIG. 4 is a graph that shows the frequency characteristics of the audio in the space in which the acoustic system is placed.

FIG. 4 is a drawing that shows schematically the case in which audio having a uniform level has been generated in the entire audible frequency band in the space in which the acoustic system 1 is placed as well as the frequency characteristics in the space. FIG. 4(*a*) is a graph that shows the frequency characteristics in the case where people are present in the vicinity of the microphone (the solid line) and the case where people are not present (the alternating long and short dashed line); and, for both, the horizontal axis shows the frequency and the vertical axis shows the level.

As is shown in the drawing, the frequency characteristics for the case in which people are present in the vicinity of the microphone closely resembles the frequency characteristics for the case in which there are no people present in the vicinity of the microphone. In both cases the level is greater as the frequency is higher. Also, the level of the solid line portion of the graph of FIG. 4(*a*) is greater than the level of the alternating long and short dashed line portion of the graph of FIG. 4(*a*), as the frequency is higher. Accordingly, it can be ascertained that the frequency characteristics in which the gentle level changes have been eliminated from the frequency characteristics of the case where there are people present in the vicinity of the microphone and of the case where there are no people present are virtually the same.

FIG. 4(*b*) shows the frequency characteristics in which the gentle level changes have been eliminated from the frequency characteristics of the case where there are people present in the vicinity of the microphone and from the frequency characteristics of the case where there are no people present as shown in FIG. 4(*a*). These frequency characteristics are obtained by passing the frequency characteristics shown in FIG. 4(*a*) through a band-pass filter with the level values that correspond to the frequencies as a sequence. One example of a specific method for obtaining the gentle level changes is through the calculation of a running mean, by subtracting the running mean of the level values from the level values.

Figure 5:
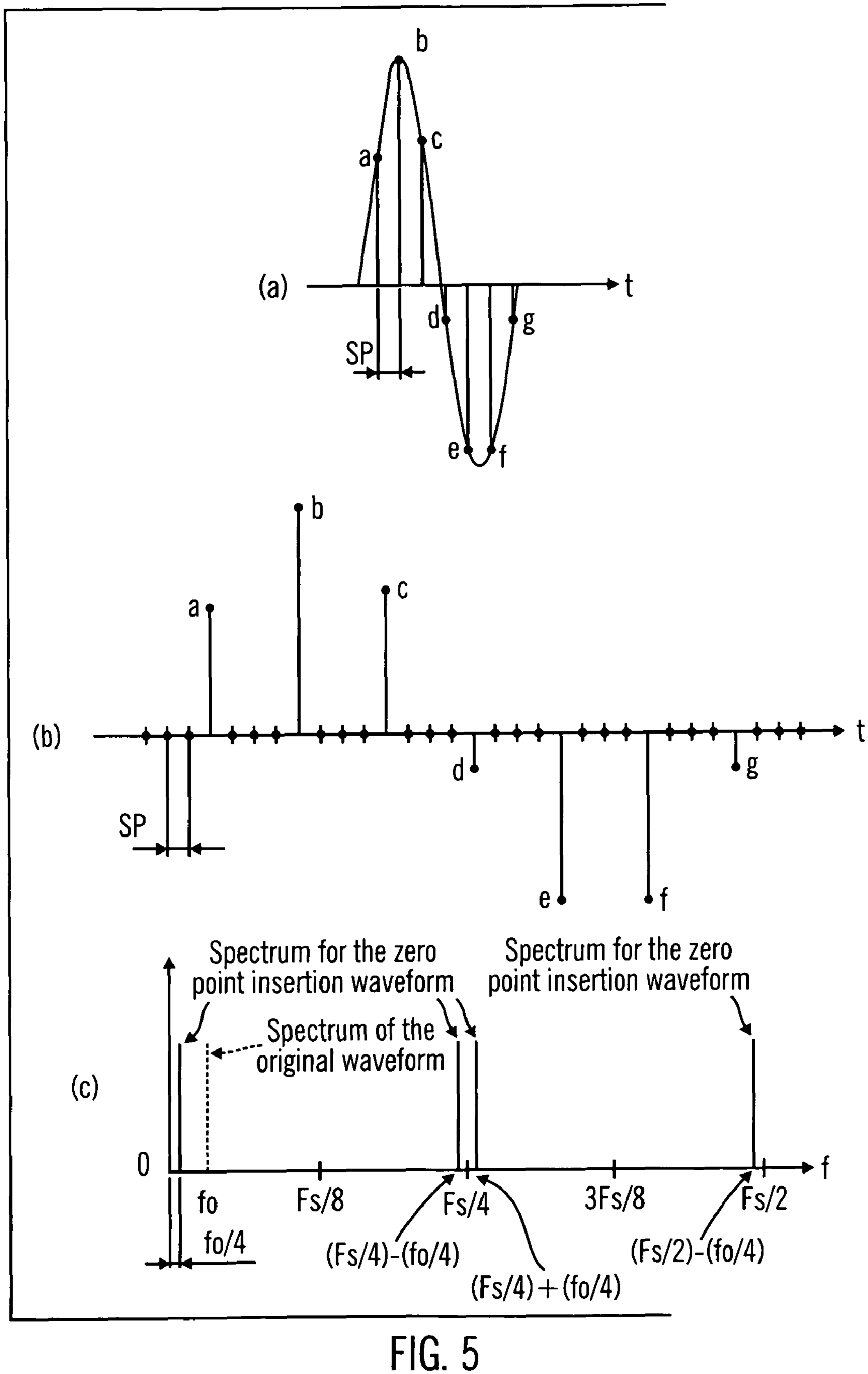
FIG. 5 is a waveform drawing that shows the aspect of the waveform that is created in the sound source.

FIG. 5 is a waveform drawing that shows the waveform of the audio that is generated by the sound source section 24. FIG. 5(*a*) shows one example of the waveforms that have been stored in the waveform memory 24*a* with which the sound source section 24 is comprised of. The horizontal axis shows the time t, and the vertical axis shows the amplitude value of the waveform. The waveform of one cycle that has specified frequency characteristics is sampled at a specified sampling period SP and the series of amplitude values a, b, c . . . are shown. These amplitude values are stored in address order in the waveform memory 24*a*.

FIG. 5(*b*) shows a waveform for which the amplitude values have been read out in order by the amplitude value readout section 24*b* from the waveform memory 24*a* and for which a plurality of 0 amplitude values have been inserted between adjacent amplitude values by the sample point addition section 24*c* at a plurality-multiple sampling period. In this preferred embodiment, the case is shown in which three sample points having a 0 amplitude value have been inserted between each adjacent amplitude value read out by the amplitude value readout section 24*b*.

FIG. 5(*c*) is a drawing that shows the frequency characteristics of the waveform that has been formed as described above and of the original waveform. The spectrum that is shown as the spectrum of the original waveform (frequency fo) in the drawing is a spectrum for the case where the waveforms that are stored in the waveform memory are formed in succession in the sampling period SP and the spectrum of the waveform in which three 0 amplitude points have been added in the same sampling period between each of the sample points of the waveform (hereinafter, referred to as the "zero point insertion waveform") is an alias spectrum with a frequency that is ¼ of the frequency fo (fo/4) of the spectrum of the original waveform.

As is shown in the drawing, the frequency of the spectrum of the zero point insertion waveform is generated once for each respective band of 0 to Fs/8, Fs/8 to Fs/4, Fs/4 to 3Fs/8, and 3Fs/8 to Fs/2 and these are generated symmetrically with respect to the Fs/8 axis and the Fs/4 axis. In other words, the frequencies of these spectra in the range of 0 to Fs/8 are fo/4, in the range of Fs/8 to Fs/4, they are Fs/4−fo/4, in the range of Fs/4 to 3Fs/8, they are Fs/4+fo/4, and in the range of 3Fs/8 to Fs/2, they are Fs/2−fo/4.

Accordingly, the spectrum of the waveforms that have been read out by the amplitude value readout section 24*b* from the original waveforms changes in a range of Fs/2 from 200 Hz, and the spectrum of the zero point insertion waveform also changes in the same manner in the four bands described above.

In this way, in contrast to the fact that the spectra of the original waveforms are concentrated at a specific frequency, the spectra of the newly formed waveforms are dispersed in the four frequency bands described above by their aliases; hence there is an effect similar to that of a chord and the musical tones are listenable with little sensation of irritation to listeners.

In addition, the original waveforms are generated at 400 Hz intervals such that the pitches are as described above, and the spectra are generated at 50 Hz intervals in each band. Accordingly, it is possible to generate musical tones having a large number of different frequencies with little change in pitch.

Figure 6:
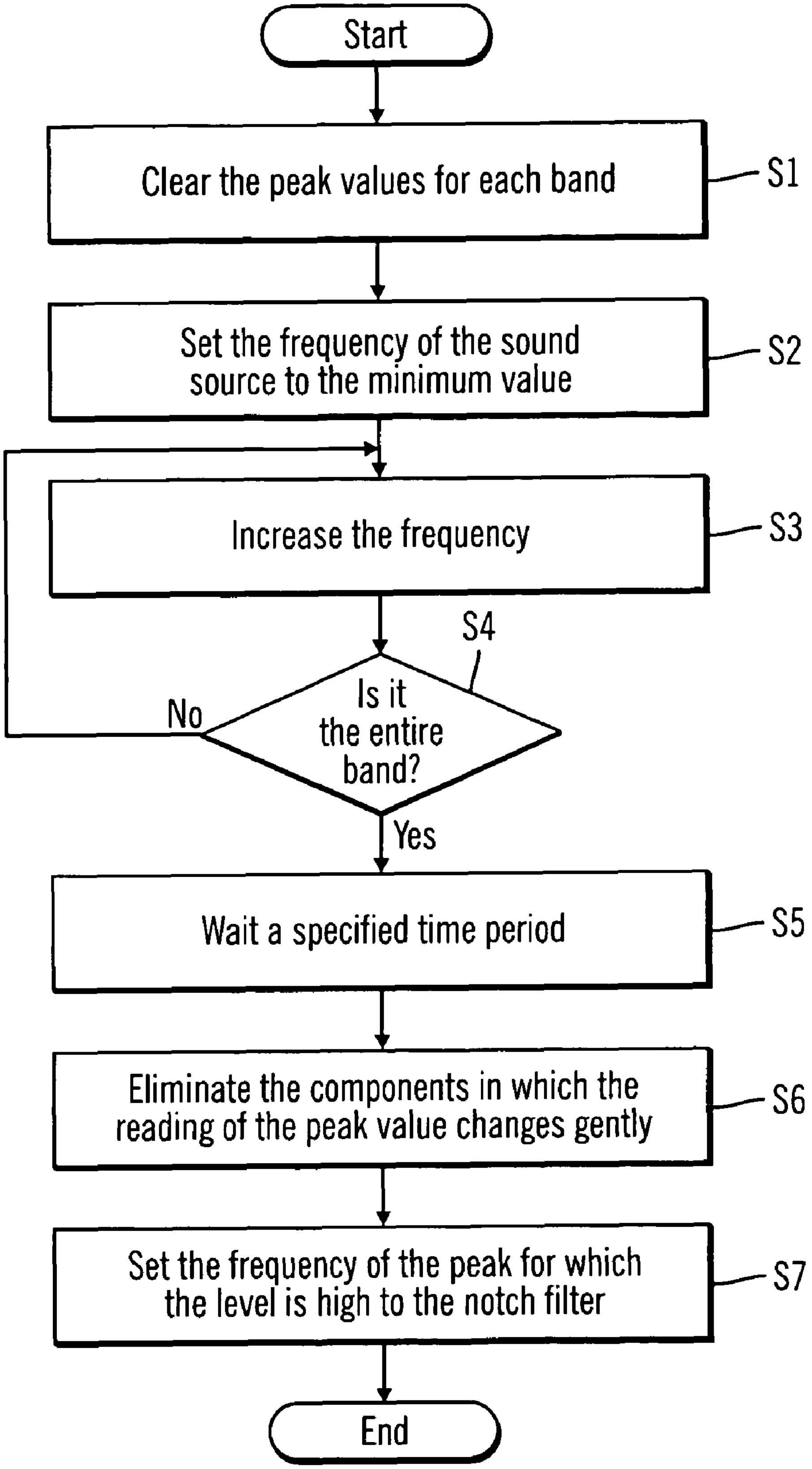
FIG. 6 is a flowchart that shows the processing in the DSP.

FIG. 6 is a flowchart that shows the processing for setting the filter in the DSP 9. The filter setting processing is the processing initiated when the scan switch 5*f* is operated. The CPU 2 detects whether or not the scan switch 5*f* is operated; and, when the operation of the scan switch 5*f* is detected, the DSP 9 is instructed to execute the filter processing and the DSP 9 begins the execution. First, the peak values of the peak detection circuits for each of the bands of the peak detection section 22 are set to 0 (S1).

Next, the readout interval of the waveform memory 24*a* is set to 1 (S2). By this means, the amplitude value readout section 24*b* successively reads out the amplitude values of the 200 Hz sine wave stored in the waveform memory 24*a*. The sample point addition section 24*c* inserts sample points for which the amplitude value is 0 in the next three sampling periods SP for the amplitude values that have been read out. By this means, the zero point insertion waveform comes to contain the 50 Hz spectrum. With this, the sound source section starts the generation of the audio and produces one-second musical tones that have the same pitch.

Next, the readout addresses are made to skip two (skipping the reading of two amplitude values) (S3). By this means, the pitch of the original waveform that is read out from the waveform memory becomes 600 Hz. In this case also, in the same manner, sample points for which the amplitude value is 0 are inserted in the next three sampling periods SP for the amplitude values that have been read out. By this means, the zero point insertion waveform comes to also contain the spectrum of 150 Hz.

In the same manner, when a one-second audio is generated at this pitch and when the following readout addresses are made to skip four (skipping the reading of four amplitude values), the pitch of the original waveform that is read out becomes 1,000 Hz and the zero point insertion waveform comes to also contain the spectrum of 250 Hz. Afterward in the processing step of S3, the reading of successive even numbered amplitude values is skipped such that six are skipped and eight are skipped and the original waveform is formed. When the pitch is made successively higher in this manner, the pitch of the original waveform that is read out 60 times becomes 23.8 kHz, and it is possible to generate musical tones that fully cover the entire audible band (S4).

In those cases where the generation of the musical tones for the entire audible band has finished (S4: yes), next, the system stands by for a period of time until the reverberations of the audio in the space become stable (S5). The time for the reverberations to become stable is different depending on the size of the space, but typically on the order of several seconds. During this time, the band division section 21 continuously divides the band of the audio that is input, and the peak detection section 22 detects and holds the peak values of the levels of the audio input for each band.

By this means, the peak values for each band are acquired. Next, the running means are successively derived for the peak values that have been acquired and are subtracted from the peak values. When the peak values of each of the bands that have been divided by the band division section 21 are made P1 through P50, for the Nth peak value PN, the nine peak values from P(N−4) to P (N+4) are added, the sum total is divided by 9 to derive the mean value, and the mean value is subtracted from PN producing a corrected PN value (S6).

By carrying out the calculations in this manner, the peak value from which gentle changes of the peak value have been excluded is obtained, and a level for each band without regard to whether there are people in the vicinity of the microphone or not is obtained. Therefore, the center frequency of the notch filter is set to the frequency for which the corrected peak value that has been obtained in this manner is large (S7).

In general, when there are people present in the vicinity of the microphone, there is a tendency for the high registers of the frequency characteristics to be raised compared to when there are no people present. Accordingly, by raising the high registers of the frequency characteristics that have been detected when there are no people present in the vicinity of the microphone, it is possible to obtain the frequency characteristics for the case in which people are present in the vicinity of the microphone. Therefore, by raising the high registers of the frequency characteristics when there are no people present in the vicinity of the microphone, it may be set such that the gentle changes of the frequency characteristics are eliminated.

As explained above, in accordance with the acoustic system of the present invention, since a plurality of sample points for which the amplitude value is 0 are inserted following the sample points that have amplitude values at a specified sampling period, the spectrum, which is the fundamental tone, and the harmonics are formed, and test audio that does not grate on the human ear is formed.

In addition, since the waveforms that have amplitude values are stored in the waveform memory while the sample points for which the amplitude value is 0 are inserted by the sample point insertion section, it is possible to store the waveforms in a waveform memory with a small capacity.

An explanation was given above regarding the present invention based on one preferred embodiment but the present invention is not in any way limited to the preferred embodiment discussed above. The possibilities of various modifications and changes that do not diverge from and are within the scope of the tenor and purport of the present invention can be easily surmised.

For example, in the preferred embodiment described above, the audio is generated with the pitch made successively higher in 100 Hz steps. However, it may also be set up such that the changes are at a logarithmically fixed interval such as where the amplitude at which the pitch is changed is 100 cents or 200 cents and the like.

In addition, in the preferred embodiment described above, it has been set up such that the input audio is passed through a plurality of band-pass filters and the frequency characteristics are detected by detecting the level of each band. However, it may also be set up such that a Fourier transform is carried out by the use of an FFT on the input audio to perform the detection.

What is claimed is:

1. A single-unit acoustic system comprising:

input means with which an audio signal is input;

conversion means that converts the audio signal from the input means into a digital signal;

a howling prevention system comprising a digital filter which reduces an output level of a specific frequency component of the digital signal converted by the conversion means; and an amplification system that amplifies the audio signal after the howling prevention systems changes frequency characteristics of said audio signal;

sound source means generating an audio signal at a specified sampling period, wherein the generated audio signal comprises some sample points having a series of non-zero amplitude values and some sample points with amplitude values made at 0 between adjacent sample points with the series of non-zero amplitude values; and output means outputting the audio signal generated by the sound source means into space;

wherein the input means inputs the audio signal outputted by the output means, and the digital filter reducing the output level of the frequency designated by the frequency designation means;

wherein the howling prevention system further comprises:

frequency characteristics detection means that detects frequency characteristics of the audio signal inputted by the input means; and frequency designation means that designates a frequency based on the frequency characteristics detected by the frequency characteristics detection means;

wherein the digital filter reduces the output level of the frequency designated by the frequency designation means; and wherein in the sound source means further comprises:

waveform storage means storing a series of amplitude values in which specified waveforms have been sampled at a specified sampling period;

amplitude value readout means reading out successive amplitude values from the waveform storage means; and sample point addition means adding the sample points between the adjacent amplitude values read out by the amplitude value readout means at a specified sampling period, wherein amplitude values of the sample points added are made 0.

2. The single-unit acoustic system according to claim 1, further comprising a speaker driven by an output of the amplification system.

3. The acoustic system according to claim 1, wherein:

the waveform storage means stores waveforms of audio signals of a specified frequency band, and the sound source means further comprising pitch changing means that controls a readout pitch of the amplitude value readout means, such that the amplitude value readout means changes a pitch of the waveform that is read out.

4. The acoustic system according to claim 1, further comprising:

level correction means correcting a level for a frequency detected by the frequency characteristics detection means through the elimination of a gentle level change with respect to frequency, and control means carries out control such that from among levels that correspond to frequencies corrected by the level correction means, a frequency for which the level is great is assigned as the frequency for which the output level is reduced on a priority basis by the digital filter.

5. The acoustic system according to claim 4 wherein the level correction means corrects the level for the frequency by subtracting a running mean value of the level for the frequency from the value of the level for the frequency.

6. The acoustic system according to claim 4 wherein the level correction means corrects the value of the level for the frequency such that as the frequency becomes higher, the value of the level becomes greater.

7. The acoustic system according to claim 4 wherein:

the filter means further comprises a plurality of notch filters that reduces levels for a plurality of frequencies; and the control means that carries out control such that center frequencies of each of the notch filters are assigned in succession to the frequencies for which the levels corrected by the level correction means are greater.

8. An acoustic system that comprises:

input means with which an audio signal is input;

filter means that detects frequency characteristics of the audio signal inputted by the input means, and reduces the output level of a specific frequency component of the audio signal in conformance with the frequency characteristics detected;

sound source means generating an audio signal at a specified sampling period, wherein said audio signal has some sample points that have a series of amplitude values and some sample points with amplitude values made at 0 between adjacent sample points with an amplitude value; and output means outputting the audio signal generated by the sound source means into space;

wherein the input means inputs the audio signal outputted by the output means; and wherein the sound source means further comprises:

waveform storage means storing a series of amplitude values in which specified waveforms have been sampled at a specified sampling period;

amplitude value readout means reading out the series of amplitude values in succession from the waveform storage means; and sample point addition means that adds sample points at a specified sampling period between the adjacent amplitude values read out by the amplitude value readout means, where the amplitude values for the added sample points are made at 0.

9. The acoustic system according to claim 8, wherein:

the waveform storage means stores the waveforms of the audio signals in a specified frequency band, and the sound source means further comprises pitch changing means that controls a readout pitch of the amplitude value readout means, such that the amplitude value readout means changes the pitch of the waveform that is read out.

10. An acoustic system comprising:

an input device for inputting an input audio signal, a howling prevention system, a speaker, wherein the howling prevention system comprises:

an A/D converter for converting the input audio signal to a digital signal, a DSP for processing the digital signal converted from the input audio signal to eliminate howling, a D/A converter for converting the digital signal processed by the DSP to an output signal to be outputted by the speaker, and an operating panel, wherein the DSP comprises:

a band division section dividing the digital signal converted from the input audio signal into a plurality of frequency bands, a peak detection section detecting a plurality of peak levels, wherein each peak level corresponds to each of the plurality of frequency bands, and a notch filter section reducing levels of the plurality of frequency bands, wherein the notch filter is set by the peak detection section according to the detected peak levels of the frequency bands; and wherein the DSP further comprises a sound source section for the generation of an audio test tone, wherein the sound source section comprises:

a waveform memory storage section for storing a plurality of amplitude values corresponding to a waveform with a predetermined pitch, an amplitude value readout section reading out the plurality of amplitude values stored in the waveform memory storage section, and a sample point addition section adding one or more 0 value amplitude points between adjacent amplitude points read out by the amplitude value readout section to create a second waveform with a different pitch.

11. The acoustic system according to claim 10, wherein the amplitude value readout section reads out the plurality of amplitude values stored in the waveform memory storage section one at a time or skipping one or more amplitude values between read-outs to form a waveform with a different pitch.

12. The acoustic system according to claim 11, wherein the sound source section generates the audio test tone such that frequencies of the audio test tone are dispersed into four frequency bands to form a musical tone.

13. The acoustic system according to claim 11, wherein the sound source section generates an audio test tone that substantially covers the range of frequency from 20 Hz to 20 kHz.

14. The acoustic system according to claim 13, wherein the DSP eliminates gentle level changes in frequency characteristics of the input audio signal by subtracting an average level from the level of each frequency band, wherein the average level is calculated from averaging levels of a group of neighboring bands.

15. The acoustic system according to claim 13, wherein the DSP alters frequency characteristics of the input audio signal such that higher frequency bands have higher values for their corresponding levels.

16. A method of eliminating the howling from an acoustic system comprising a howling prevention system, comprising the steps of:

inputting an input audio signal by a microphone of the acoustic system, converting the audio signal into a digital signal by an A/D converter of the howling prevention system, processing the digital signal converted from the input audio signal to eliminate howling using a DSP of the howling prevention system, converting the digital signal into an output audio signal using a D/A converter of the howling prevention system, outputting the output audio signal into space through a speaker of the acoustic system, and generating a test tone using a sound source section of the DSP, wherein the generation of the test tone comprises steps of:

storing a plurality of amplitude values of a waveform of a predetermined pitch in a waveform memory storage section of the sound source section, reading out the amplitude values of the waveform stored in the waveform memory storage section using an amplitude value readout section of the sound source section, and adding one or more 0 value amplitude points between adjacent amplitude points read out by the amplitude value read out section using a sample point addition section of the sound source section to form a second waveform with a different pitch wherein the step of processing the digital signal converted from the input audio signal to eliminate howling comprise the steps of:

dividing the digital signal converted from the input audio signal into a plurality of frequency bands using a band division section of the DSP, detecting the peak level of each frequency band using a peak detection section of the DSP, setting a notch filter section of the DSP using the peak detection section according to the detected peak levels of the frequency bands, and reducing the levels of the plurality of frequency bands using the notch filter.

17. The method of eliminating howling according to claim 16, further comprising the steps of:

skipping one or more amplitude values during the read out by the amplitude value readout section to form a waveform with a different pitch, dispersing frequencies of the test tone generated using the sound source section into four frequency bands to form a musical tone.

18. The method of eliminating howling according to claim 17, wherein when a scan switch on an operating panel of the acoustic system is activated, the acoustic system sets the howling prevention system comprising the steps of:

producing the audio test tone using the sound source section, outputting the audio test tone into a space near the acoustic system using the speaker, inputting the audio test tone outputted to the space using the microphone, and setting the notch filter based on using the audio test tone as the input audio signal.

19. The method of eliminating howling according to claim 17, further comprising the steps of:

calculating an average level for a group of neighboring frequency bands for each frequency band, subtracting the average level from a level of each frequency band to eliminate gentle level changes in the frequency characteristics of the input audio signal.

20. The method of eliminating howling according to claim 17, further comprising the step of altering the frequency characteristic of the input signal such that higher frequency bands have higher values for their corresponding levels.

* * * * *